United States Patent [19]

Goto et al.

[11] Patent Number: 5,710,509
[45] Date of Patent: Jan. 20, 1998

[54] PHASE DIFFERENCE DETECTION DEVICE FOR AN INDUCTIVE POSITION DETECTOR

[75] Inventors: Atsutoshi Goto, Shinmachi 1-77-2, Fuchu-shi, Tokyo-to; Yasuhiro Yuasa, Fuchu; Shuiti Tanaka, Kodaira; Nobuyuki Akatsu, Higashiyamato; Kazuya Sakamoto, Hamura; Hiroshi Sakamoto, Kawagoe; Akio Yamamoto, Kunitachi, all of Japan

[73] Assignee: Atsutoshi Goto, Japan

[21] Appl. No.: 550,358

[22] Filed: Oct. 30, 1995

[51] Int. Cl.⁶ .................. G01B 7/30; G01D 5/20; G01D 5/243; H03M 1/64
[52] U.S. Cl. .................. 324/207.25; 318/656; 318/661; 324/207.12; 324/207.18; 341/115; 341/116
[58] Field of Search .................. 324/165, 207.12, 324/207.17, 207.18, 207.19, 207.23, 207.24, 207.25; 318/656–661; 327/4; 341/112, 115, 116

[56] References Cited

U.S. PATENT DOCUMENTS

| | | | |
|---|---|---|---|
| 3,504,361 | 3/1970 | Catton | 341/116 |
| 3,584,783 | 6/1971 | Kobori | |
| 3,648,042 | 3/1972 | Perrett | 318/661 X |
| 3,851,330 | 11/1974 | Huber | |
| 4,011,440 | 3/1977 | Steglich | 318/654 X |
| 4,039,946 | 8/1977 | Nola | 324/165 |
| 4,297,698 | 10/1981 | Pauwels et al. | 340/870.32 |
| 4,468,617 | 8/1984 | Ringwall | 324/165 |
| 4,468,618 | 8/1984 | Zander | 324/165 |
| 4,754,220 | 6/1988 | Shimizu et al. | 324/208 |
| 5,066,911 | 11/1991 | Hulsing | 324/207.18 |

FOREIGN PATENT DOCUMENTS

| | | |
|---|---|---|
| 0 738 046 | 10/1996 | European Pat. Off. |
| 1 304 377 | 1/1973 | United Kingdom |

*Primary Examiner*—Gerald R. Strecker
*Attorney, Agent, or Firm*—Graham & James LLP

[57] ABSTRACT

Two A.C. output signals amplitude-modulated in accordance with two function values (sine and cosine) differing from each other in correspondence to a position-to-be-detected are received from a position sensor such as a resolver. By performing an addition or subtraction between a signal derived by shifting the electric phase of one of the received A.C. output signals by a predetermined angle, and the other received signal, two electric A.C. signals ($\sin(\omega t \pm d \pm \theta)$, $\sin(\omega t \pm d - \theta)$) are electrically synthesized which have electric phase angles ($\theta$) corresponding to the position-to-be-detected and are phase-shifted in opposite directions. "$\pm d$" here represents phase variation error caused by factors, other than the position-to-be-detected, such as temperature change. In the synthesized two signals, the phase variation errors ($\pm d$) appear in the same direction, while the phase differences ($\theta$) corresponding to the position are shifted in opposite, positive and negative, directions. Thus, by measuring the respective phase shift amounts ($\pm d \pm \theta$, $\pm d - \theta$) and performing appropriate operation, it is allowed to cancel out or extract the error ($\pm d$) so that an accurate phase difference ($\theta$) can be detected.

8 Claims, 7 Drawing Sheets

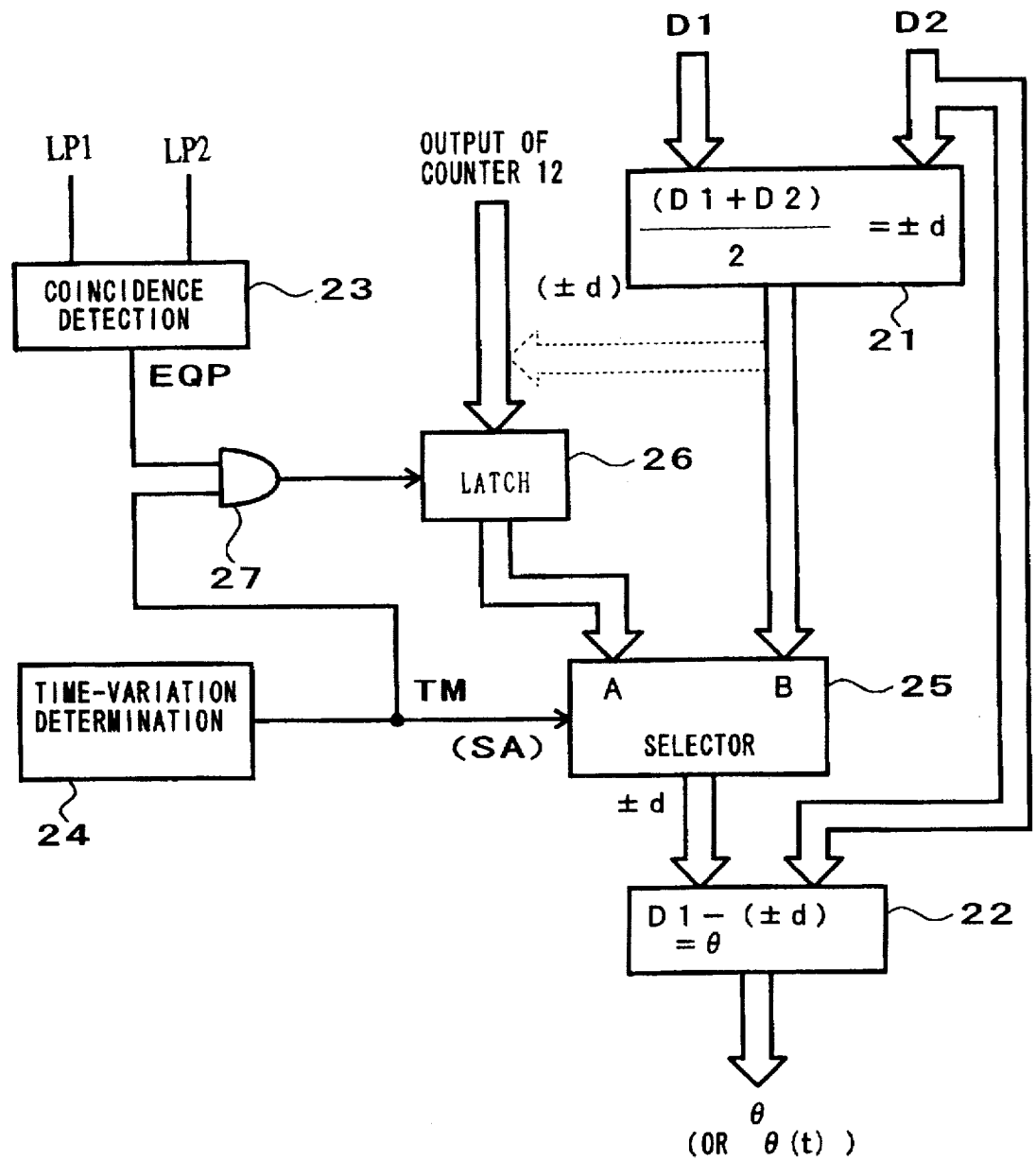
F I G. 3

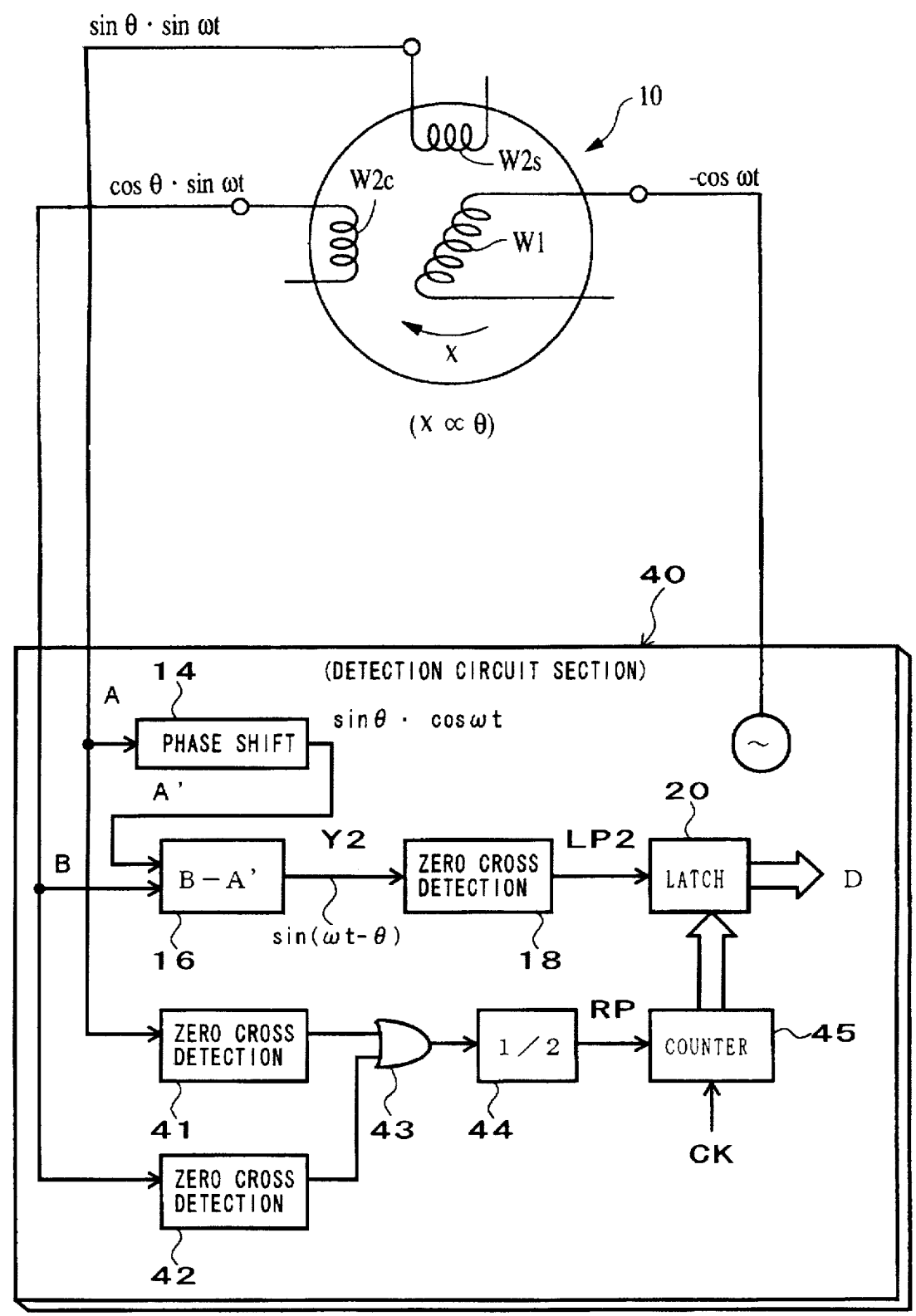
F I G. 4

PHASE DIFFERENCE DETECTION DEVICE FOR AN INDUCTIVE POSITION DETECTOR

BACKGROUND OF THE INVENTION

The present invention relates to a phase difference detection device for use in position detection and a position detection system which are applicable to detection of both rotational positions and linear positions, such as a rotational position detector like a resolver or synchro, or a linear position detector based on a similar position detecting principle. More particularly, the present invention relates to a technique to detect an absolute position on the basis of an electric phase difference.

Among various induction-type rotational position detectors, one which produces two-phase (sine phase and cosine phase) outputs in response to a single-phase exciting input is commonly known as a "resolver", and others which produce three-phase (phases shifted 120° in relation to one another) outputs in response to a single-phase exciting input is known as a "synchro". The oldest-fashioned resolvers have double-pole (sine pole and cosine pole) secondary windings provided on the stator in such a manner to cross each other at a mechanical angle of 90°, with a primary winding provided on the rotor (the relationship between the primary and secondary windings may be reversed depending on a desired application). However, the resolvers of this type are disadvantageous in that they require brushes for electric contact with the primary winding on the rotor. Brushless resolvers eliminating the need for such brushes are also known, where a rotary transformer is provided on the rotor in place of the brushes.

R/D converters have long been known as a detection system which obtains position detection data in digital form by use of a resolver which produces two-phase (sine phase and cosine phase) outputs in response to a single-phase exciting input. FIG. 6 is a block diagram illustrating an example of a detection system in such an R/D converter, where a resolver is used as a sensor section 1. A single-phase exciting signal (e.g., $-\cos \omega t$) generated from a detection circuit section 2 is applied to a primary winding W1, and respective output signals of two-phase secondary windings W2s and W2c are input to the detection circuit section 2. The output signals of the two-phase secondary windings W2s and W2c are induced signals having, as amplitude coefficients, a sine value $\sin \theta$ and a cosine value $\cos \theta$ corresponding to a rotational angle $\theta$ of the rotor, and can be expressed by, for example, "$\sin \theta \cdot \sin \omega t$" and "$\cos \theta \cdot \sin \omega t$", respectively. In the detection circuit section 2, sequential phase generation circuit 3 generates digital data of phase angle $\phi$, and sine/cosine generation circuit 4 generates analog signals of sine value $\sin \phi$ and cosine value $\cos \phi$ corresponding to the phase angle $\phi$. Multiplier 5 multiplies the sine phase output signal "$\sin \theta \cdot \sin \omega t$" from the sensor section 1 by the cosine value $\cos \phi$ from the sine/cosine generation circuit 4, to thereby obtain "$\cos \phi \cdot \sin \theta \cdot \sin \omega t$". Another multiplier 6 multiplies the cosine phase output signal "$\cos \theta \cdot \sin \omega t$" from the sensor section 1 by the sine value $\sin \phi$ from the sine/cosine generation circuit 4, to thereby obtain "$\sin \phi \cdot \cos \theta \cdot \sin \omega t$". Subtracter 7 calculates a difference between the output signals of the multipliers 5 and 6, and in response to the output of the subtracter 7, the phase generating operation of the sequential phase generation circuit 3 is controlled as follows. Namely, the phase angle $\phi$ to be generated by the sequential phase generation circuit 3, after being initially reset to "0", is increased sequentially until the subtracter 7 outputs "0". The output of the subtracter 7 becomes "0" when a condition of "$\cos \phi \cdot \sin \theta \cdot \sin \omega t$"="$\sin \phi \cdot \cos \theta \cdot \sin \omega t$" is satisfied, i.e., when $\phi = \theta$ is established and digital data indicative of the phase angle $\phi$ from the sequential phase generation circuit 3 is coincident with a digital value of the rotational angle $\phi$. Thus, in this detection system, a reset trigger signal is periodically applied to the sequential phase generation circuit 3 at optional timing so as to reset the phase angle $\phi$ to "0" to thereby initiate incrementing of the angle $\phi$, and when the output of the subtracter 7 reaches "0", the incrementing of the phase angle $\phi$ is stopped to obtain digital data indicative of a detected angle $\theta$.

Another detection system is also known, where the resolver exciting method is modified to produce a single-phase output in response to two-phase exciting inputs so that an output signal containing an electric phase difference angle corresponding to rotational angle $\theta$ is obtained to thereby derive digital data indicative of a detected angle $\theta$. In FIG. 7, there is shown an example of such a phase difference detection system, where a resolver is used as a sensor section 1. Two-phase exciting signals (e.g., $\sin \omega t$ and $-\cos \omega t$) generated in a detection circuit section 8 are applied to primary windings W1s and W1c, respectively, and an output signal of a single-phase secondary winding W2 is input to the detection circuit section 8. The output signal of the secondary winding W2 is an induced signal having an electric phase difference angle $\theta$ corresponding to a rotational angle $\theta$ of the rotor, and can be expressed by, for example, $\sin(\omega t - \theta)$ for convenience. In the detection circuit section 8, counter 9 counts predetermined high-speed clock pulses CK so that sine/cosine generation circuit 10 generates exciting sine and cosine signals $\sin \omega t$ and $-\cos \omega t$ using such a count as an instantaneous phase value and supplies the generated signals $\sin \omega t$ and $-\cos \omega t$ to the primary windings W1s and W1c, respectively, of the sensor section 1. Then, the sensor section 1 applies the output signal $\sin(\omega t - \theta)$ of the secondary winding W2 to a zero-cross detection circuit 11, which supplies a latch pulse LP to a latch circuit 12 upon detection of a "zero" phase angle. In turn, the latch circuit 12 latches a counted value of the counter 9 at the timing of the latch pulse LP. The modulus of the counter 9 corresponds to one cycle of the exciting sine signal $\sin \omega t$, and a counted value "0" of the counter 9 corresponds to a zero phase of the signal $\sin \omega t$. Accordingly, the content of the latch circuit 12 latched in response to a zero phase of the output signal $\sin(\omega t - \theta)$ coincides with a phase difference angle $\theta$ from a zero phase of the sine signal $\sin \omega t$ to a zero phase of the output signal $\sin(\omega t - \theta)$. Specific examples of the above-mentioned phase difference detection system are disclosed in U.S. Pat. Nos. 4,754,220, 4,297,698, etc.

As known in the art, the windings of the sensor section 1 tend to undesirably change in impedance under the influence of ambient temperature change, and thus the electric phase of A.C. signals induced in the secondary subtly fluctuates in response to the temperature change. Additionally, the electric phase of the induced A.C. signals received by the detection circuit section 2 or 8 varies under the influence of various factors other than a position-to-be-detected, such as ununiform wiring lengths between the sensor section 1 and the detection circuit section 2 or 8 and delays in various circuit operations. If the phase variation based on the various factors, other than the position-to-be-detected, such as the temperature change, is expressed by "±d" for convenience of description, the subtracter 7, in the former-type detection system as shown in FIG. 6, performs a calculation of "$\cos \phi \cdot \sin \theta \cdot \sin(\omega t \pm d) - \sin \phi \cdot \cos \theta \cdot \sin(\omega t \pm d)$", from which it is seen that the variation amount "±d" is in effect cancelled out and hence has no effect at all on the detecting accuracy. Therefore, it can be seen that the detection system as shown in FIG. 6 is a high-accuracy system insusceptible to adverse influence of the ambient temperature change. However, because this detection system is based on a so-called "successive incrementing method" where, as noted earlier, a reset trigger signal is periodically applied to the sequential phase generation circuit 3 at optional timing to reset the phase angle φ to "0" so as to initiate incrementing of the angle φ, and the incrementing of the phase angle φ is stopped upon arrival at "0" of the output of the subtracter 7 to thereby obtain digital data indicative of a detected angle θ, it has to wait for a period from the time when the reset trigger is given to the time when the phase angle φ coincides with the detected angle θ and hence presents poor response characteristics.

On the other hand, in the latter-type detection system as shown in FIG. 7, the output signal of the secondary winding becomes sin(ωt±d−θ) due to the phase variation amount "±d" based on the non-positional factors (other than the position-to-be-detected) such as temperature change, so that a zero phase point detected by the zero-cross detection circuit 11 would differ by "±d" from a normal zero phase point in the case of sin(ωt−θ). Thus, the data latched in the latch circuit 12 would represent a value which undesirably corresponds to "(±d−θ)" rather than the normal angle "θ", and this results in a very significant problem that the variation "±d" directly appears as a detection error. Although the system presents superior high-speed response characteristics due to its capability to immediately latch data corresponding to a detected angle in response to the latch pulse LP, the detection error based on the non-positional factors such as temperature change is often very critical.

SUMMARY OF THE INVENTION

It is therefore an object of the present invention to provide a phase difference detection device for position detection and a position detection system which can perform a high-accuracy position detection without being influenced by unwanted phase variation caused by various factors, other than a position-to-be-detected, such as impedance change in a position sensor due to temperature change, and which also presents superior high-speed response characteristics.

In order to accomplish the above-mentioned object, the present invention provides a phase difference detection device for position detection which comprises an input section for receiving first and second A.C. output signals from a position sensor (10), the position sensor (10) generating the first A.C. output signal (sin θ·sin ωt) having been amplitude-modulated using, as an amplitude coefficient, a first function value (sin θ) corresponding to a position-to-be-detected (x) and generating the second A.C. output signal (cos θ·sin ωt) having been amplitude-modulated using, as an amplitude coefficient, a second function value (cos θ) corresponding to the position-to-be-detected (x), an electric circuit section (14, 15, 16) for performing an addition or subtraction between a signal (sin θ·cos ωt) derived by shifting the electric phase of the first A.C. output signal (sin θ·sin ωt) received by the input section by a predetermined angle (π/2) and the second A.C. output signal (cos θ·sin ωt) so as to synthesize at least one electric A.C. signal (sin(ωt+θ)) having an electric phase angle corresponding to the position-to-be-detected, and an operation section (17, 18, 19, 20, 21, 22; 18, 20, 41, 42, 43, 44, 45) for measuring an electric phase shift in at least one of the electric A.C. signals synthesized by the electric circuit section so as to obtain position detection data (θ) corresponding to the position-to-be-detected. It should be understood that reference characters in parentheses are added herein just to facilitate cross-reference to the corresponding signals and circuits in the later described embodiments.

The position sensor (10) for generating the A.C. output signals (sin θ·sin ωt and cos θ·sin ωt) amplitude-modulated by two different function values in correspondence to the position-to-be-detected (x) is a known sensor such as a resolver. The present invention is characterized in that output signals from such a known position sensor (10) (i.e., output signals to which phase-modulation corresponding to the position-to-be-detected has not been applied) is input to the device for detection of a phase difference thereof so that an absolute position can be detected on the basis of the phase difference detection.

Namely, by performing an addition or subtraction between a signal (sin θ·cos ωt) derived by shifting the electric phase of the first A.C. output signal received from the position sensor (10) by a predetermined angle and the second A.C. output signal (cos θ·sin ωt), at least one electric A.C. signal (sin(ωt+θ)) is synthesized which has an electric phase angle corresponding to the position-to-be-detected. In a specific example, a first electric A.C. signal (sin(ωt+θ)) phase-shifted in a positive direction can be synthesized on the basis of the addition, e.g., (sin θ·cos ωt +cos θ·sin ωt), while a second electric A.C. signal (sin(ωt −θ)) phase-shifted in a negative direction can be synthesized on the basis of the subtraction, e.g., (−sin θ·cos ωt+cos θ·sin ωt).

If a fundamental time-varying phase of the obtained A.C. signal is represented by "ωt" and phase variation caused by impedance change of the sensor's wiring due to temperature change and other factors than the position-to-be-detected (i.e., non-positional factors) is represented by "±d ", then the first electric A.C. signal may be expressed as "sin(ωt ±d+θ)" and the second electric A.C. signal as "sin(ωt ±d −θ)". That is, the electrical phase differences (θ), corresponding to the position-to-be-detected (x), for the first and second electric A.C. signal appear as opposite (positive and negative)-direction phase shifts. However, the phase variations "±d" for both of the first and second electric A.C. signals have effects in the same positive or negative direction depending on the current conditions. Thus, by measuring the respective phase differences "(±d +θ)" and "(±d−θ)" of the first and second electric A.C. signals and performing an appropriate operation such as an addition or subtraction on the measured differences, it is possible to cancel out or extract the phase variation "±d" and also detect the phase difference (θ) free of the phase variation "±d" which accurately corresponds to the position-to-be-detected (x).

For example, there may be included a section for determining an electric phase difference (±d+θ) between a predetermined reference A.C. signal (sin ωt) and the first electric A.C. signal (sin(ωt ±d+θ)) so as to obtain first phase data (D1), a section for measuring an electric phase difference (±d−θ) between the predetermined reference A.C. signal (sin ωt) and the second electric A.C. signal (sin(ωt ±d−θ)) to obtain second phase data (D2), and a section for calculating position detection data corresponding to the position-to-be-detected on the basis of the first and second phase data (D1 and D2). This section for calculating position detection data may be designed to obtain error data (±d) by calculating a difference between the respective absolute values of the first and second phase data (D1, D2). For example, by performing a calculation of (D1±D2) /2, a condition of {(±d+θ)+(±d−θ)}/2=2(±d)/2=±d is established, so that the error data (±d) can be obtained. So, by an operation to remove the error data from one of the first and second phase data, it is possible to obtain the phase difference (θ) accurately corresponding to the position-to-be-detected (x), from, for example, "D1−(±d) =±d+θ−(±d)=+θ".

In another example, the condition of (ωt±d+θ)−(ωt ±d−θ) =2θ may be met by directly measuring an electric phase difference between the above-mentioned first and second electric A.C. signals. In this case as well, the phase variation "±d" is cancelled out so that it is possible to) obtain only phase difference data (2θ) proportional to a static electric phase angle (θ) corresponding to the position-to-be-detected (x). This phase difference data (2θ) may be used directly as detection data proportional to the position-to-be-detected (x). Alternatively, an electric phase angle (θ) averaged in half may be obtained for use as the detection data proportional to the position-to-be-detected (x).

Consequently, the present invention permits a high-accuracy position detection without being influenced by various factors, other than the position-to-be-detected, such as impedance change of the sensor due to temperature change and ununiform lengths of wiring cables. Further, because the present invention is based on the technique of measuring a phase difference (θ) in A.C. signals, the instant latching method as shown in FIG. 7 may be employed rather than the conventional successive incrementing method as shown in FIG. 6, and thus the invention can achieve a phase difference detection device or position detection system which presents superior high-speed characteristics.

In the case where the position-to-be-detected (x) time-varies or moves with time, it happens that the frequency or period of the first electric A.C. signal (sin(ωt±d+θ)) and second electric A.C. signal (sin(ωt±d−θ)) vary in opposite directions from each other. To cope with such a dynamic characteristic, the detection device may further comprises a section (23) for detecting a coincidence in zero cross between the first and second electric A.C. signals (sin(ωt±d+ θ) and sin(ωt±d−θ)), and a holding section (26) for, in response to detection of a coincidence in zero cross between the first and second electric A.C. signals, holding, as error data (±d), data (D1 and D2) based on an electric phase difference, from a predetermined reference A.C. signal, of at least one of the first and second electric A.C. signals. In this case, the operation section modifies the above-mentioned position detection data based on the electric phase difference of at least one of the first and second electric A.C. signals, by use of the error data (±d) held by the holding section (26) at least when the position-to-be-detected is moving.

Namely, in the case where the position-to-be-detected (x) time-varies, the phase shift amount (θ) also time-varies, and hence the above-noted "+θ" and "−θ" may be represented as "+θ(t)" and "−θ(t) ", respectively. Where the θ time-varies in the positive and negative directions, the phase variation "±d" can not be cancelled out or extracted by the above-mentioned simple addition/subtraction alone, which would inevitably result in insufficient accuracy. Therefore, to cope with such a dynamic characteristic, the detection device may be designed to detect a coincidence in zero cross between the first and second electric A.C. signals (sin(ωt±+θ)) and (sin(ωt ±d−θ)); hold, as error data (±d), data based on the electric phase difference, from a predetermined reference A.C. signal, of at least one of the first and second electric A.C. signals (i.e., at least one of the first and second phase data D1 and D2), in response to detection of a zero cross coincidence; and modify the position detection data (i.e., at least one of the first and second phase data D1 and D2) based on the electric phase difference of the electric A.C. signal by use of the error data (±d) held at least when the position-to-be-detected is moving.

Detection of a zero cross coincidence signifies an instant when the two signals are both in a zero phase, which also means that phase differences (±d+θ) and (±d−θ), from the reference phase ωt, of the two signals are equal. Namely, this is the very moment when the condition of ±d+θ=±d−θ is satisfied, i.e., when θ=0. Accordingly, for the first and second phase data (D1 and D2) obtained when a zero-cross coincidence is detected, D1=±d+θ=D2 =±d−θ=±d is established, so that it is possible to hold, as the error data (±d), data based on at least one of the first and second phase data (D1 and D2). Thus, by extracting the error data (±d) to be held and then modifying at least one of the successively varying first and second phase data D1 and D2 by use of the held error data (±d), it is possible to obtain accurate time-variant phase difference data (+θ(t)) free of the phase variation "±d" which corresponds only to the position-to-be-detected (x) even in the case when the position (x) time-varies, as seen from, for example, D1−(±d)={±d+θ(t)}−(±d)=+θ(t)

As another form of embodying the present invention, such an approach may be employed where only one electric A.C. signal (sin(ωt±d−θ)) is synthesized and a reference phase to be used for phase difference determination is created on the basis of outputs of the position sensor (10). That is, the reference phase signal is formed by synthesizing zero crosses of the two electric A.C. output signals (sin θ·sin ωt and cos θ·sin ωt ) generated by the position sensor (10). Since this reference phase signal is based on the outputs of the position sensor (10), it contains the phase difference (±d) and is in synchronism with sin(ωt±d). Therefore, by measuring the phase difference (θ), from the reference phase signal (sin(ωt±d), of the above-mentioned electric A.C. signal (sin(ωt±d−θ)), it is possible to obtain accurate position detection data free of the phase error component (±d) which accurately corresponds to the position-to-be-detected (x). The characterizing point here is that the reference phase signal to be used for phase difference determination is created by synthesizing zero crosses of the first A.C. output signal (sin θ·sin ωt) and second A.C. output signal (cos θ·sin ωt) generated from the position sensor (10). These first and second A.C. output signals (sin θ·sin ωt and cos θ·sin ωt) are same in electric phase, but differ in amplitude value depending on the phase angle θ. Therefore, in synthesizing zero crosses of the two signals, a relatively high-accuracy zero cross detection is always possible for any one of the signals without being influenced by variations of the amplitude values sin θ and cos θ responding to the phase angle θ. According to this form of embodiment, because the phase error "±d" can be removed similarly to the above-mentioned, a high-accuracy position detection is possible without being influenced by various factors, other than the position-to-be-detected, such as impedance change of the sensor due to temperature change and ununiform lengths of wiring cables. Further, a phase difference detection device or position detection system can be provided which presents superior high-speed characteristics.

The present invention may employ a known resolver, or any other similar single-phase exciting/two(or multiple)-phase output position sensor. Such a position sensor is constructed to generate a first A.C. output signal (sin θ·sin ωt) having as an amplitude value a first function value (sin θ) corresponding to the position-to-be-detected (x) and a second A.C. output signal (cos θ·sin ωt) having as an amplitude value a second function value (cos θ) corresponding to the position-to-be-detected (x). In such a case, the above-mentioned first electric A.C. signal, such as expressed by sin θ·cos ωt+cos θ·sin ωt=sin(ωt+θ), may be synthesized by performing an addition between a signal derived-from by shifting the electric phase of the first A.C. output signal (sin θ·sin ωt) by a predetermined angle, say, 90° so as to be sin θ·cos ωt, and the second A.C. output signal (cos θ·sin ωt). Alternatively, the above-mentioned second electric A.C. signal, such as expressed by cos θ·sin ωt−sin θ·cos ωt=sin (ωt−θ), may be synthesized by performing a subtraction between the signal derived by shifting the electric phase of the first A.C. output signal (sin θ·sin ωt) by a predetermined angle so as to be sin θ·cos ωt, and the second A.C. output signal (cos θ·sin ωt). The same application will also be possible, through appropriate design alterations, to the case of a single-phase exciting/three-phase output position sensor such as a synchro.

For better understanding of the features of the present invention, the preferred embodiments of the invention will be described below with reference to the accompanying drawings.

BRIEF DESCRIPTION OF THE DRAWINGS

In the accompanying drawings:

FIG. 3 is a block diagram illustrating a position detection system in accordance with another embodiment of the present invention;

FIG. 4 is a block diagram illustrating a position detection system in accordance with still another embodiment of the present invention;

DETAILED DESCRIPTION OF THE PREFERRED EMBODIMENTS

Figure 1:
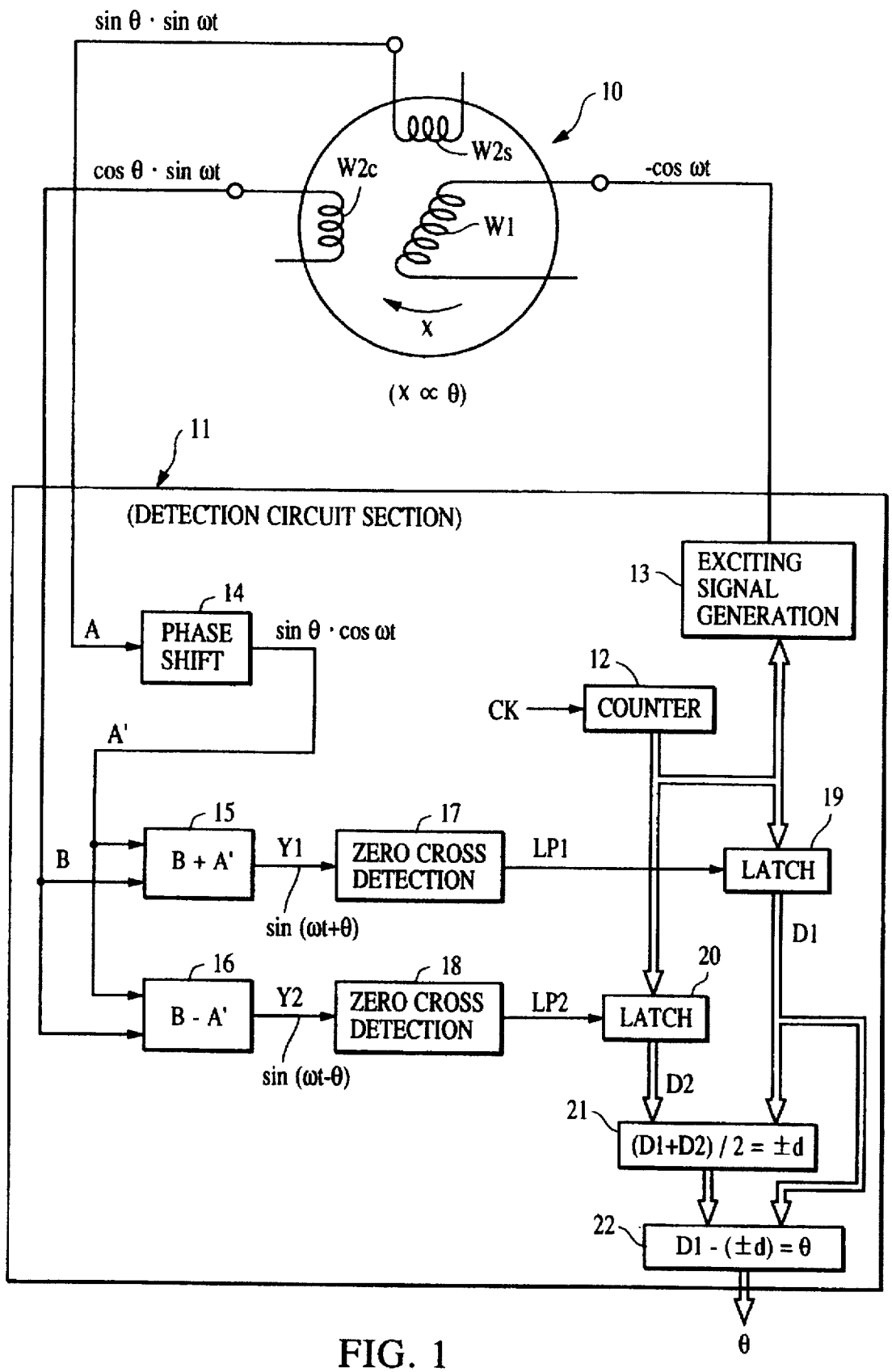
FIG. 1 is a block diagram illustrating a position detection system in accordance with an embodiment of the present invention.

In FIG. 1, positional sensor 10 may be a position sensor of any desired type having a single-phase exciting input and two-phase outputs. For example, the position sensor 10 may be a conventionally known resolver of the brushless or brush-equipped type. Alternatively, the position sensor 10 may be a variable-reluctance type position sensor such as a "Microsyn" (trade name) where primary and secondary windings are provided on the stator with no winding on the rotor or movable member, or it may be either a rotational position sensor or linear position detecting sensor.

A single-phase exciting A.C. signal (denoted by "−cos ωt" for convenience of description) generated in a detection circuit section 11 is applied to the position sensor 10 so as to excite the primary winding W1. In the position sensor 10, A.C. output signals are induced in the two-phase secondary windings W2s and W2c in response to excitation of the primary winding W1, and the respective induced voltage levels of the signals present two-phase functional characteristics, sin θ and cos θ, corresponding to a particular position to be detected (position-to-be-detected) x. That is, the induced output signals of the secondary windings W2s and W2c are output with their amplitudes modulated by the two-phase functional characteristics sin θ and cos θ corresponding to the position-to-be-detected x. It is assumed herein that x=θ or x is proportional to θ. Further, for convenience of description, coefficients relating to other conditions such as the respective turns of the windings will not be taken into account, and the secondary winding W2s is assumed to be of sine phase with its output signal represented by "sin θ·sin ωt" whereas the other secondary winding W2c is assumed to be of cosine phase with its output signal represented by "cos θ·sin ωt". That is, the secondary winding W2s outputs a first A.C. output signal A (=sin θ·sin ωt) having as its amplitude value a first function value sin θ corresponding to the position-to-be-detected x, and the secondary winding W2c outputs a second A.C. output signal B (=cos θ·sin ωt) having as its amplitude value a second function value cos θ corresponding to the position-to-be-detected x.

In the detection circuit section 11, counter 12 counts predetermined high-speed clock pulses CK, exciting signal generation circuit 13 generates an exciting A.C. signal (e.g., −cos ωt) on the basis of a counted value of the counter 12, and the generated A.C. signal is supplied to the primary winding W1 of the position sensor 1. The modulus of the counter 12 corresponds to one cycle of the exciting A.C. signal, and it is assumed herein, for convenience of description, that its counted value "0" corresponds to the zero phase of reference sine signal sin ωt. Assuming that one complete cycle of the reference sine signal sin ωt from the zero to maximum phases is generated during one cycle of counting of the counter 12 from zero to the maximum value, each exciting A.C. signal −cos ωt is generated, by the exciting signal generation circuit 13, at a phase 90° delayed behind the reference sine signal sin ωt.

The first and second A.C. output signals A and B of the position sensor 10 are supplied to the detection circuit section 11. In the detection circuit section 11, the first A.C. output signal A (=sin θ·sin ωt) is input to a phase shift circuit 14 so that it is shifted in electric phase by a predetermined amount (e.g., 90°) so as to provide a phase-shifted A.C. signal A' (=sin θ·cos ωt). The detection circuit section 11 also includes adder and subtracter circuits 15 and 16. In the adder circuit 15, the phase-shifted A.C. signal A' (=sin θ·cos ωt) from the phase shift circuit 14 and the above-mentioned second A.C. output signal B (=cos θ·sin ωt) are added together so as to obtain, as an added output signal, a first electric A.C. signal Y1 that may be expressed by a brief formula of B+A'=cos θ·sin ωt+sin θ·cos ωt=sin(ωt+θ). On the other hand, in the subtracter circuit 16, a subtraction between the phase-shifted A.C. signal A' (=sin θ·cos ωt) from the phase shift circuit 14 and the above-mentioned second A.C. output signal B (=cos θ·sin ωt) is performed so as to obtain, as a subtracted output signal, a second electric A.C. signal Y2 that may be expressed by a brief formula of B−A'=cos θ·sin ωt−sin θ·cos ωt=sin(ωt−θ). In this way, there can be obtained, through electric processing, the first electric A.C. signal Y1 (=sin(ωt+θ)) having an electric phase (+θ) shifted in the positive direction in correspondence to the position-to-be-detected x, and the second electric A.C. signal Y2 (=sin(ωt−θ)) having an electric phase (−θ) shifted in the negative direction in correspondence to the position-to-be-detected x.

The above-mentioned output signals Y1 and Y2 of the adder and subtracter circuits 15 and 16 are given to zero-cross detection circuits 17 and 18 for detection of the respective zero-cross points of the signals Y1 and Y2. The zero-cross detection is done by, for example, identifying a point where the signal Y1 or Y2 changes from a negative value to a positive value, i.e., a zero phase point. Zero-cross detection pulses generated by the circuits 17 and 18 upon detection of the respective zero-cross points are applied as latch pulses LP1 and LP2 to corresponding latch circuits 19 and 20. Each of the latch circuits 19 and 20 latches a counted value of the counter 12 at the timing of the corresponding latch pulse LP1 or LP2. Since, as noted earlier, the modulus of the counter 12 corresponds to one cycle of the exciting A.C. signal and its counted value "0" corresponds to a zero phase of the reference sine signal sin ωt, data D1 and D2 thus latched in the latch circuits 19 and 20 correspond to phase differences of the output signals Y1 and Y2 with respect to the reference sine signal sin ωt. Output data from the latch circuits 19 and 20 are supplied to an error calculation circuit 21, which in turn conducts a computation of "(D1+D2)/2". This computation may in practice be conducted by right (downward)-shifting by one bit the sum of the binary data "D1+D2".

If the phase variation error is represented by "±d" considering possible influence of ununiform lengths of wiring cables between the position sensor 10 and detection circuit section 11 and impedance change caused by the temperature change in the windings W1, W2s and W2c of the position sensor 10, the above-mentioned signals handled in the detection circuit section 11 may be expressed as follows:

$$A = \sin\theta \cdot \sin(\omega t \pm d);$$

$$A' = \sin\theta \cdot \cos(\omega t \pm d);$$

$$B = \cos\theta \cdot \sin(\omega t \pm d);$$

$$Y1 = \sin(\omega t \pm d + \theta);$$

$$Y2 = \sin(\omega t \pm d - \theta);$$

$$D1 = \pm d + \theta;$$

and $$D2 = \pm d - \theta$$

Namely, since the phase difference counting is performed using the reference sine signal sin ωt as a reference phase, the phase difference measurement data D1 and D2 will contain the phase variation error "±d" as previously mentioned. The phase variation error "±d" can be calculated by the error calculation circuit 21 using the following expression:

$$(D1+D2)/2 = \{(\pm d+\theta)+(\pm d-\theta)\}/2 = \pm 2d/2 = \pm d$$

Data indicative of the phase variation error "±d" calculated by the error calculation circuit 21 is delivered to a subtracter circuit 22, where the data "±d" is subtracted from one (D1) of the phase difference measurement data D1 and D2. That is, because the subtracter circuit 22 carries out a subtraction of "D1−(±d)", $$D1-(\pm d) = \pm d + \theta - (\pm d) = \theta,$$

and thus there can be obtained digital data indicative of an accurate phase difference θ from which the phase variation error "±d" has been removed. From the foregoing, it will be readily understood that the present invention allows only the accurate phase difference θ corresponding to the position-to-be-detected x to be extracted by cancelling out the phase fluctuation error "±d".

Figure 2A:
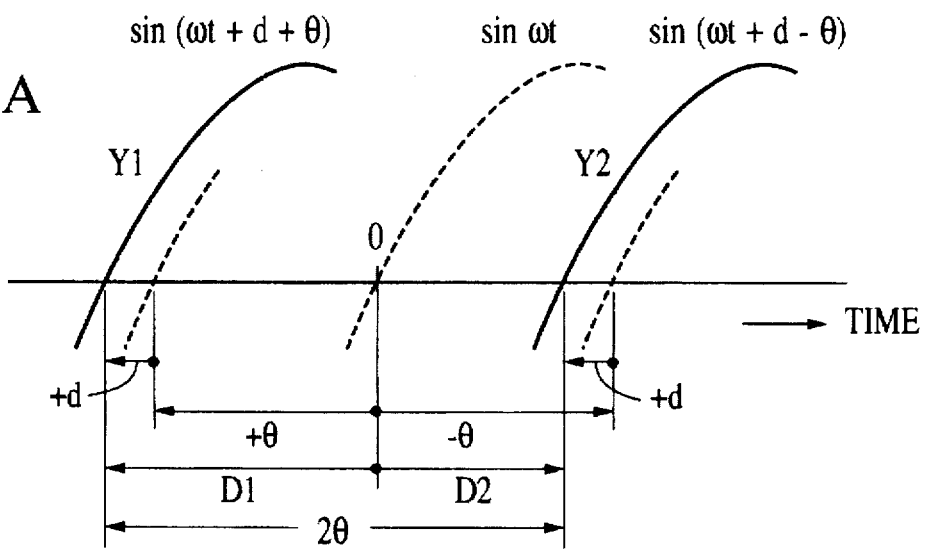
FIGS. 2A and 2B are diagrams explanatory of the operation of the position detection system shown in FIG. 1.
Figure 2B:
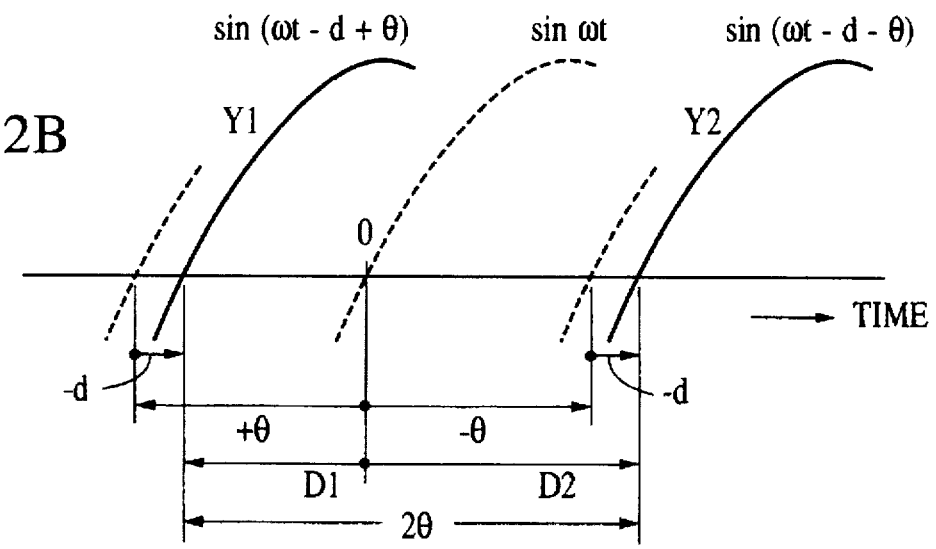

This feature will be described in greater detail with reference to FIGS. 2A and 2B, which show waveforms, at and around a zero phase point, of the sine signal sin ωt used as the phase measuring reference and the first and second A.C. signals Y1 and Y2; FIG. 2A shows such waveforms in the case where the phase variation error is positive, whereas FIG. 2B shows such waveforms in the case where the phase variation error is negative. In the case shown in FIG. 2A, the zero phase of the first signal Y1 is displaced or shifted, by "θ+d", ahead of that of the reference sine signal sin ωt, and phase difference detection data D1 corresponding thereto represents a phase difference equivalent to "θ+d". Further, the zero phase of the second signal Y2 is displaced or shifted, by "−θ+d", behind that of the reference sine signal sin ωt, and phase difference detection data D2 corresponding thereto represents a phase difference equivalent to "−θ+d". In this case, the error calculation circuit 21 calculates a phase variation error "+d" on the basis of $$(D1+D2)/2 = \{(+d+\theta)+(+d-\theta)\}/2 = +2d/2 = +d$$

Then, the subtracter circuit 22 carries out a calculation of $$D1-(+d) = +d+\theta-(+d) = \theta,$$

to thereby extract an accurate phase difference θ.

On the other hand, in the case shown in FIG. 2B, the zero phase of the first signal Y1 leads, by "θ−d", that of the reference sine signal sin ωt, and phase difference detection data D1 corresponding thereto represents a phase difference equivalent to "θ−d". Further, the zero phase of the second signal Y2 lags, by "−θ−d", that of the reference sine signal sin ωt, and phase difference detection data D2 corresponding thereto represents a phase difference equivalent to "−θ−d". In this case, the error calculation circuit 21 calculates a phase fluctuation error "+d" on the basis of $$(D1+D2)/2 = \{(-d+\theta)+(-d-\theta)\}/2 = -2d/2 = -d$$

Then, the subtracter circuit 22 carries out a calculation of $$D1-(-d) = -d+\theta-(-d) = \theta,$$

to thereby extract an accurate phase difference θ.

Alternatively, the subtracter circuit 22 may carry out a subtraction of "D2−(±d)", and by so doing, there can be obtained data (−θ) which in principle reflects an accurate phase difference θ in a similar manner to the above-mentioned.

As seen from FIGS. 2A and 2B as well, the electric phase difference between the first and second signals Y1 and Y2 is 2θ, which always represents the double of the accurate phase difference θ where the phase variation errors "±d" in the two signals Y1 and Y2 have been cancelled out. Therefore, the structure of the circuitry including the latch circuits 19 and 20, error calculation circuit 21, subtracter circuit 22 etc. may be modified, if necessary, in such a manner to directly obtain the electric phase difference 2θ between the first and second signals Y1 and Y2. For example, digital data corresponding to the electric phase difference 2θ where the phase variation errors "±d" in the two signals Y1 and Y2 have been cancelled out may be obtained by using a suitable means to gate a period between generation of the pulse LP1 corresponding to a zero phase of the first signal Y1 output from the zero-cross detection circuit 17 and generation of the pulse LP2 corresponding to a zero phase of the second signal Y2 output from the zero-cross detection circuit 18, and counting the gated period. Then, data corresponding to θ can be obtained by downward-shifting the digital data by one bit.

The latch circuit 19 for latching "+θ" and latch circuit 20 for latching "−θ" in the above-mentioned embodiment have just been described as latching a count output of the same counter 12, and no specific reference has been made to the sign (positive or negative sign) of the latched data. However, the sign of the data may be selected as desired by applying an appropriate design choice in accordance with the spirit of the present invention. If, for example, the modulus of the counter 12 is 4,096 (in decimal notation), it will suffice to perform necessary arithmetic by relating its possible digital counts 0 to 4,095 to phase angles 0° to 360°. In the simplest example, the necessary arithmetic may be performed by using the uppermost bit of a counted output of the counter 12 as a sign bit and relating digital counts 0 to 2,047 to +0° to +180° and digital counts 2,048 to 4,095 to −180° to −0°. In another example, digital counts 4,095 to 0 may be related to negative angle data −360° to −0° by the input or output data of the latch circuit 20 into 2's complements.

Although the above-described embodiment uses the single-phase exciting input/two-phase output position sensor 10 to generate the first and second A.C. signals Y1 (=sin (ωt+θ)) and Y2=sin(ωt−θ)) via the electric circuitry within the detection circuit section 11, a three-phase output or three (or more than three)-phase output position sensor may be used.

Incidentally, no particular problem arises when the position-to-be-detected x is in a stationary state; however, as the position x varies timewise, the corresponding phase angle θ also time-varies. In such a case, the phase difference value θ between the respective output signals Y1 and Y2 of the adder and subtracter circuits 15 and 16, rather than assuming a fixed value, presents dynamic characteristics time-varying in correspondence with the moving speed. If this is represented by θ(t), then the respective output signals Y1 and Y2 may be expressed by $$Y1=\sin\{\omega t \pm d+\theta(t)\}$$

$$Y2=\sin\{\omega t \pm d-\theta(t)\}$$

Namely, the phase-leading output signal Y1 shifts in frequency, with respect to the frequency of the reference signal sin ωt, in a direction where the frequency increases in accordance with the "+θ(t)", whereas the phase-lagging output signal Y2 shifts in frequency, with respect to the frequency of the reference signal sin ωt, in a direction where the frequency decreases in accordance with the "−θ(t)". Because, under such dynamic characteristics, the respective periods of the signals Y1 and Y2 successively shift in the opposite directions for each cycle of the reference signal sin ωt, the measured time references of the latched data D1 and D2 in the latch circuits 19 and 20 will differ from each other, so that the accurate phase variation errors "±d" can not be obtained by mere operations of the circuits 21 and 22.

A simplest possible way to avoid such a problem is to limit the function of the device of FIG. 1 in such a manner that the device ignores outputs obtained when the position-to-be-detected x is moving timewise and instead measures the position x in a stationary state by use of only outputs obtained in the stationary state. Thus, the present invention may be embodied for such a limited purpose.

But, in the case where the object-of-detection x is for example a rotation shaft of a motor, it is usually necessary to detect ever-changing rotational positions of the motor. Thus, it will be desirable to be able to accurately detect every phase difference θ corresponding to a varying position-to-be-detected x even during the time-variation of the object. Therefore, a description will be made below, with reference to FIG. 3, about an improvement of the present invention which, in order to address the above-mentioned problem, is capable of detecting every phase difference θ corresponding to a varying position x even during the time-variation of the position x. FIG. 3 extractively shows a modification of the error calculation and subtracter circuits 21 and 22 in the detection circuit section 11 of FIG. 1, and the other components not shown in the figure may be the same as in FIG. 1. If phase difference θ corresponding to the time-varying position-to-be-detected x is represented by +θ(t) and −θ(t), the output signals Y1 and Y2 can be expressed as the above-mentioned. Then, the phase difference measurement data D1 and D2 obtained by the latch circuits 19 and 20 are $$D1=\pm d+\theta(t)$$

$$D2=\pm d+\theta(t)$$

In this case, "±d+θ(t)" will repeatedly time-vary in the positive direction over a range from 0° to 360° in response to the time-variation of the phase difference θ, whereas "±d−θ(t)" will repeatedly time-vary in the negative direction over a range from 360° to 0° in response to the time-variation of the phase difference θ. Thus, although ±d+θ(t) ≠±d−θ(t) results sometimes, the variations of the two data intersect each other some other time, and thereby ±d+θ(t)= ±d−θ(t) is established. When ±d+θ(t) =±d−θ(t), the output signals Y1 and Y2 are in phase and the latch pulses LP1 and LP2 corresponding to the respective zero-cross detection timing of the signals Y1 and Y2 are generated at the same timing.

In FIG. 3, a coincidence detection circuit 23 detects a coincidence in the generation timing of the latch pulses LP1 and LP2 corresponding to the respective zero-cross detection timing of the output signals Y1 and Y2, and generates a coincidence detection pulse EQP upon detection of such a coincidence. A time-variation determination circuit 24 determines, via an optional means (e.g., means for detecting presence or absence of time-variation in the value of one of the phase difference measurement data D1), that the position-to-be-detected x is in the time-varying mode, and it outputs a time-varying mode signal TM upon such a detection.

Selector 25 is provided between the error calculation and subtracter circuits 21 and 22 so that when no time-varying mode signal TM is generated (TM="0"), i.e., when the position-to-be-detected x is not time-varying, the output signal applied from the error calculation circuit 21 to selector input B is selected to be fed to the subtracter circuit 22. When the input B of the selector 25 is selected, the circuitry of FIG. 3 operates in a manner equivalent to the circuitry of FIG. 1; that is, when the position-to-be-detected x is at rest, i.e, not moving, the output data of the calculation circuit 21 is fed directly to the subtracter circuit 22 via the input B so that the circuitry operates as in FIG. 1.

In contrast, when the time-varying mode signal TM is generated (TM="1"), i.e., when the position-to-be-detected x is time-varying, the output signal applied from the latch circuit 26 to selector input A is selected to be fed to the subtracter circuit 22. Then, once the coincidence detection pulse EQP is generated while the mode signal is "1", an AND condition is satisfied in AND gate 27, which thus outputs a pulse responsive to the coincidence detection pulse EQP. The output pulse of the AND gate 27 is given as a latch command to the latch circuit 26, which latches output count data of the counter 12 in response to the latch command. Because, when the coincidence detection pulse EQP is generated, the output of the counter 12 will be latched concurrently in both the latch circuits 19 and 20, D1=D2 is met, and hence the data latched in the latch data 26 is equivalent to D1 or D2 (provided that D1=D2).

Further, because the coincidence detection pulse EQP is generated once the respective zero-cross detection timing of the output signals Y1 and Y2 coincides, i.e., once "±d+θ(t) =±d−θ(t)" is met, the data latched in the latch data 26 in response to the pulse EQP is equivalent to D1 or D2

(provided that D1=D2) and therefore equivalent to (D1+D2)/2

This means (D1+D2)/2={(±d+θ(t))+(±d−θ(t))}/2=2(±d)/2=±d and hence further means that the data latched in the latch data 26 is an accurate indication of the phase variation error "±d".

Thus, when the position-to-be-detected x is time-varying, data accurately indicating the phase variation error "±d" is latched in the latch circuit 26 in response to the coincidence detection pulse EQP, and the output data of this latch circuit 26 is sent via the input A to the subtracter circuit 22. Accordingly, the subtracter circuit 22 can obtain only the data θ (θ(t) in the case where the position x is time-varying) which accurately corresponds only to the position x and from which the phase variation error "±d" has been eliminated.

In the modified example of FIG. 3, the AND gate 27 may be omitted so that the coincidence detection pulse EQP is applied directly to the latch control input of the latch circuit 26.

Further, as denoted by a broken-line arrow, the latch circuit 26 may latch the output data "±d" of the error calculation circuit 21 rather than the output count data of the counter 12. In such a case, the output timing from the calculation circuit 21 of the output data is slightly delayed behind the generation timing of the coincidence detection pulse EQP due to operational delays of the latch circuits 19 and 20 and calculation circuit 21, so it is preferable that the output of the calculation circuit 21 be latched into the latch circuit 26 after having undergone appropriate adjustment against the time delay.

It should also be readily understood that in the case where the detection circuit section 11 is constructed taking only dynamic characteristics into account, it is possible to omit the circuit 21 and selector 25 of FIG. 3 and one of the latch circuits 19 or 20 of FIG. 1.

FIG. 4 shows another embodiment of the phase difference detecting operation directed to cancelling phase variation error "±d", where there is employed a single-phase exciting input/two-phase output position sensor 10 as in the embodiment of FIG. 1.

First and second A.C. output signals A and B are introduced into a detection circuit section 40. The first A.C. output signal A (=sin θ·sin ωt) is input to a phase shift circuit 14 of the section 40, where its electric phase is shifted by a predetermined amount to provide a phase-shifted A.C. signal A' (=sin θ·cos ωt). In a subtracter circuit 16, a subtraction between the phase-shifted A.C. signal A' (=sin θ·cos ωt) and the second A.C. output signal B (=cos θ·sin ωt) is performed to provide an A.C. signal Y2 that may be expressed by a brief formula of B−A'=cos θ·sin ωt−sin θ·cos ωt=sin(ωt−θ). The output signal Y2 of the subtracter circuit 16 is fed to a zero-cross detection circuit 18 so that a latch pulse LP2 is output upon detection of a zero-cross point and supplied to a latch circuit 20.

The embodiment of FIG. 4 is different from that of FIG. 1 in terms of a reference phase that is used to measure a phase difference amount θ from an A.C. signal Y2 (=sin(ωt −θ)) containing the phase difference corresponding to the position-to-be-detected x. More specifically, in the embodiment of FIG. 1, the reference phase used to measure the phase difference amount θ is the zero phase of the reference sine signal sin ωt which is not input to the position sensor 10 and hence does not contain phase variation error "±d" caused by various factors such as variation of wiring impedance due to temperature change etc. Because of this, the embodiment of FIG. 1 forms two A.C. signals, Y1 (=sin (ωt+θ)) and Y2 (=sin(ωt−θ)) and cancels out the phase variation error "±d" by calculating a phase difference between the two signals. In contrast, the embodiment of FIG. 4 is designed to eliminate the phase variation error "±d" by, on the basis of the first and second output signals A and B output from the position sensor 10, forming the reference phase to be used for measuring the phase difference amount θ in such a manner that the reference phase itself contains the error "±d".

More specifically, in the detection circuit section 40 of FIG. 4, the first and second output signals A and B output from the position sensor 10 are input to zero-cross detection circuits 41 and 42, respectively, each of which detects a zero-cross of the corresponding input signal. It is assumed herein that each of the detection circuits 41 and 42 outputs a zero-cross detection pulse in response to both a positive-going zero-cross point where the amplitude of the corresponding input signal A or B changes from a negative value to a positive value (so to speak, 0° phase) and a negative-going zero-cross point where the amplitude of the corresponding input signal A or B changes from a positive value to a negative value (so to speak, 180° phase). The reason is that, because sin θ and cos θ determining the positive or negative polarity of the amplitude of each signal A and B become positive or negative in response to the value of θ, it is at least necessary to detect a zero-cross for every 180° in order to detect zero-cross points for every 360° on the basis of combination of the two signals. The zero-cross detection pulses output from the two zero-cross detection circuits 41 and 42 are ORed by an OR circuit 43, and the resultant output of the OR circuit 43 is fed to a suitable ½ frequency divider/pulse circuit 44 (which may include for example a ½ frequency divider circuit such as a T flip-flop and a pulse outputting AND gate) in such a manner that every other zero-cross detection pulse is taken out, so that the zero-cross for every 360°, i.e. zero-cross detection pulse corresponding only to the zero phase is output as a reference phase signal pulse RP. This pulse RP is applied to the reset input of a counter 45 which continually counts predetermined clock pulses CK. The counter 45 is reset to "0" whenever the reference phase signal pulse RP is applied thereto. The counted value of the counter 45 is fed to the latch circuit 20, where it is latched at the generation timing of the latch pulse LP2. Then, the data D thus latched in the latch circuit 20 is output as measurement data of the phase difference θ corresponding to the position-to-be-detected x.

The first and second A.C. output signals A and B from the position sensor 10 are expressed by A=sin θ·sin ωt and B=cos θ·sin ωt, respectively, and are in phase with each other. Respective zero-cross points should therefore be detected at the same timing; actually, however, the amplitude level of either of the signals may become "0" or close to "0" since the amplitude coefficients vary in sin θ and cos θ, in which case it is practically impossible to detect any zero-cross point of one of the signals. Thus, this embodiment is characterized in that zero-cross detection processing is performed on each of the two A.C. output signals A (=sin θ·sin ωt) and B (=cos θ·sin ωt), and the zero-cross detection outputs of the two signals are ORed so that even when no zero-cross of either of the signal can be detected because of a small amplitude level, it is possible to utilize the zero-cross detection output signal of the other signal having a relatively great amplitude level.

Figure 5A:
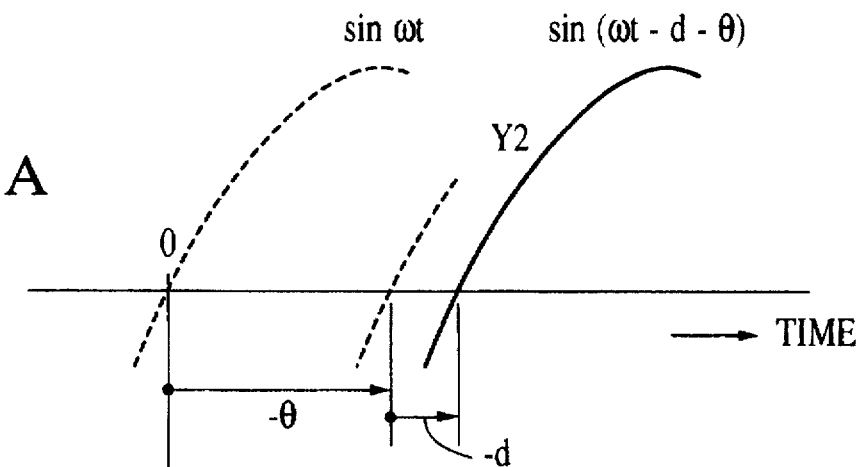
FIGS. 5A, 5B and 5C are diagrams explanatory of the operation of the position detection system shown in FIG. 4.
Figure 5B:
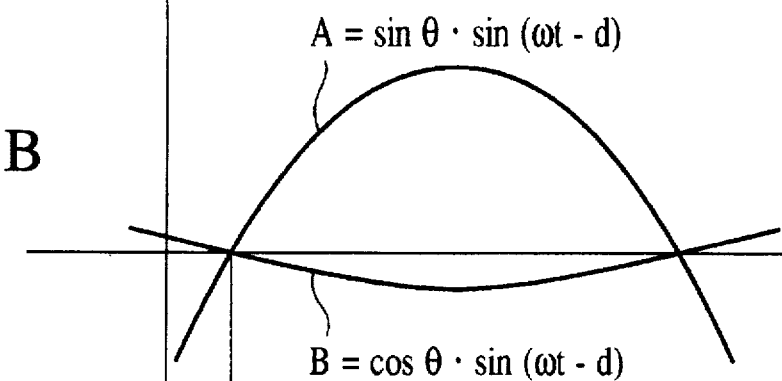
Figure 5C:
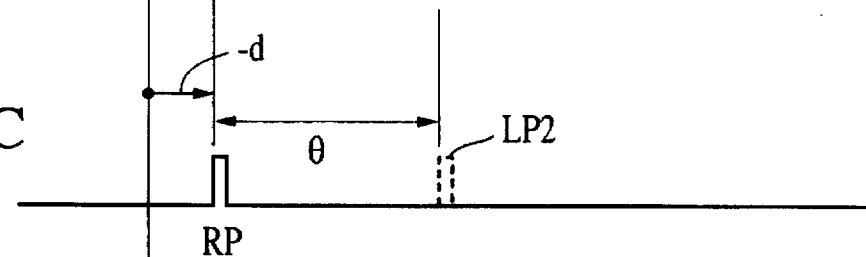
Figure 6:
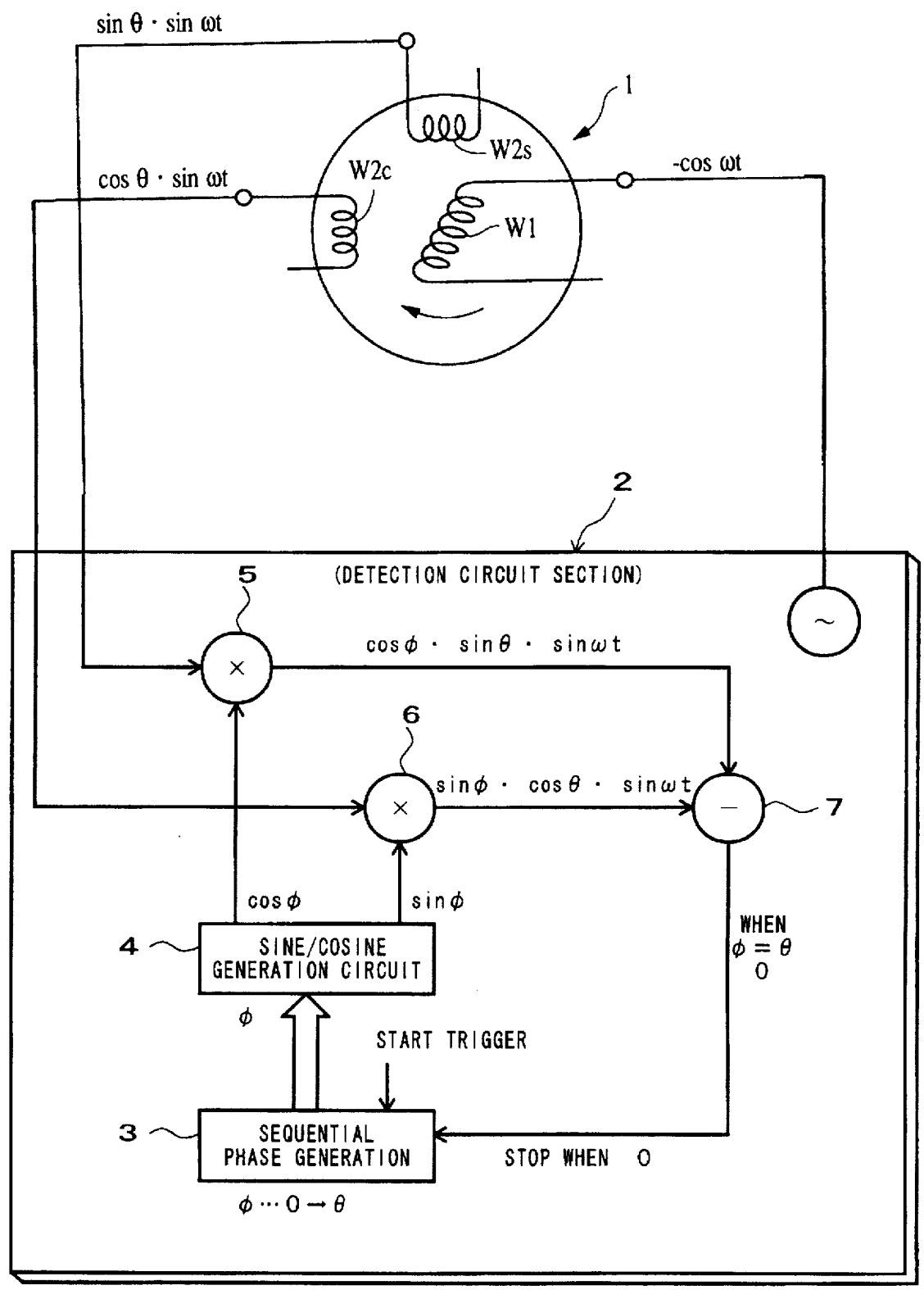
FIG. 6 is a block diagram illustrating an example of prior art.
Figure 7:
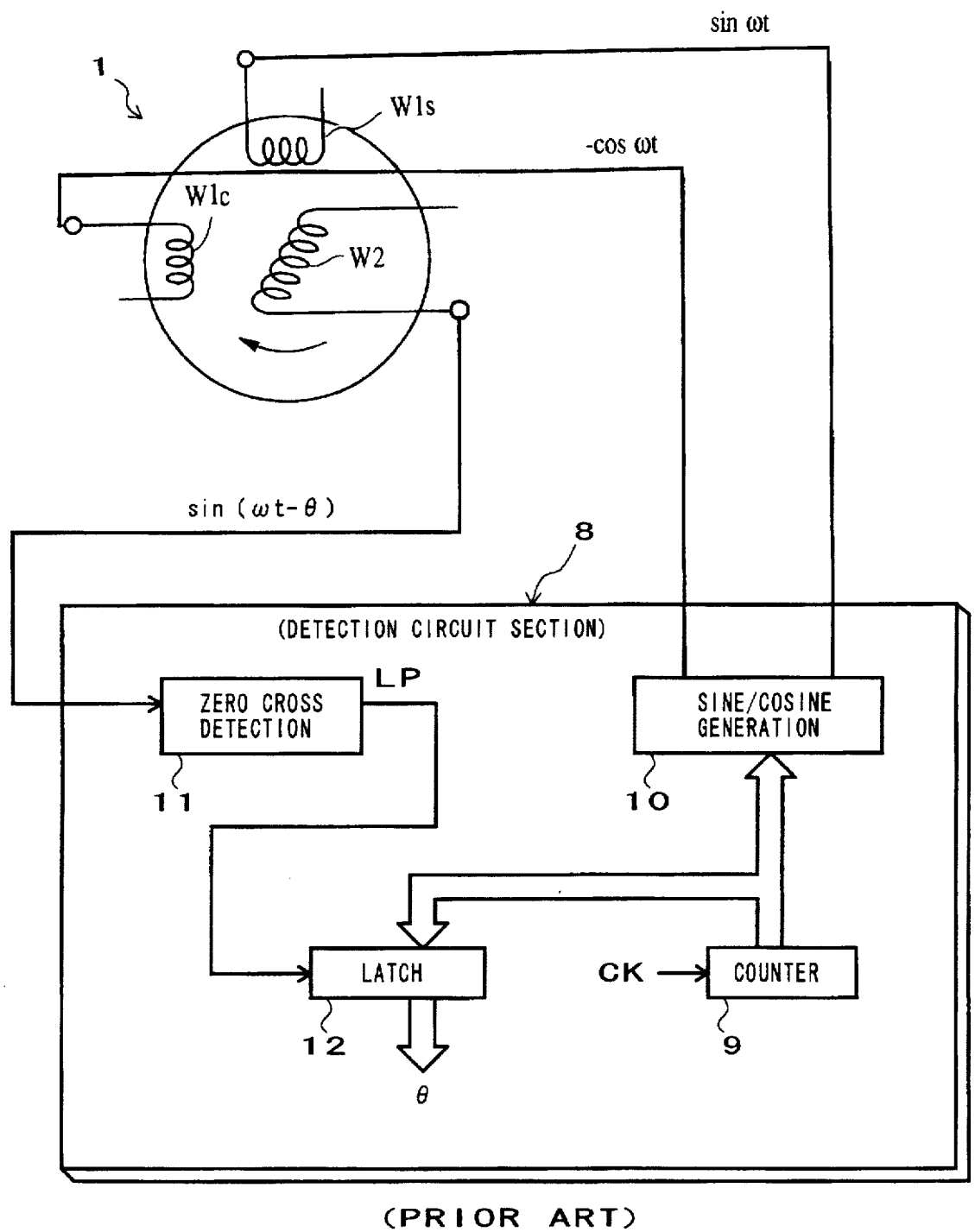
FIG. 7 is a block diagram illustrating another example of prior art.

In the FIG. 4 embodiment, if the phase variation caused by variation in wiring impedance of the position sensor 10 etc. is for example "−d", the A.C. signal Y2 output from the subtracter circuit 16 will be sin(ωt−d−θ) as shown in FIG. 5A. In this case, the output signals A and B of the position sensor 10 assume respective amplitude values sin θ and cos θ corresponding to the angle θ and contain respective phase variation errors as represented by A=sin θ·sin(ωt−d) and B=cos θ·sin(ωt−d), as shown in FIG. 5B. Consequently, the reference phase signal RP obtained at such timing as shown in FIG. 5C on the basis of the zero-cross detection is displaced, by the variation error "−d", from a zero phase of the normal reference reference sine signal sin ωt. Thus, an accurate angle value θ free of the variation error "−d" will be obtained by measuring a phase difference amount in the output A.C. signal Y2 (=sin(ωt−d−θ)) of the subtracter circuit 16.

For the position sensor 10 constructed as a rotary sensor, various high-resolution rotary sensors where the phase angle θ present a multi-cycle variation per revolution are known in addition to those where the phase angle θ present a single-cycle variation; the principle of the present invention may of course be applied to any of such high-resolution rotary sensors. Further, such a technique is known which permits detection of absolute rotational positions over a plurality of revolutions by providing a plurality of rotational position sensors to which the rotation of a rotational shaft, object of detection, is transmitted at different transmission ratios. The present invention is also applicable to that technique if position detection data of each of the rotary sensors is obtained by the phase difference detecting method. It should be obvious that the present invention may be applied to linear position detector devices as well as to rotary-type detection devices in every stage where linear position data is obtained by the phase difference detecting method.

The present invention described thus far achieves the superior advantage that it permits a high-accuracy detection responsive to a position-to-be-detected without being influenced by impedance change of the sensor due to temperature change and ununiform lengths of wiring cables. In addition, because the present invention is based on the technique to measure a phase difference in A.C. signals, it achieves a position detection with a superior high-speed response characteristic.

What is claimed is:

1. A phase difference detection device for an inductive position detector, said position detector being excited by a predetermined reference signal to generate first and second A.C. output signals, said first A.C. output signal having been amplitude-modulated using, as an amplitude coefficient, a first function value corresponding to a position-to-be-detected, and said second A.C. output signal having been amplitude-modulated using, as an amplitude coefficient, a second function value corresponding to the position-to-be-detected, said phase difference detection device comprising:

a phase shift circuit operatively coupled to said position detector to shift an electric phase of said first A.C. output signal by a predetermined angle;

an addition circuit operatively coupled to said phase shift circuit and to said position detector to perform an addition operation between an output signal of said phase shift circuit and said second A.C. output signal so as to synthesize a first data signal having an electric phase angle shifted in one of positive and negative directions in correspondence to the position-to-be-detected;

a subtraction circuit operatively coupled to said phase shift circuit and to said position detector to perform a subtraction operation between the output signal of said phase shift circuit and said received second A.C. output signal so as to synthesize a second data signal having an electric phase angle shifted in other of the positive and negative directions in correspondence to the position-to-be-detected;

a first operation circuit operatively coupled to said addition circuit to measure an electric phase difference between said predetermined reference signal and said first data signal to obtain first phase data;

a second operation circuit operatively coupled to said subtraction circuit to measure an electric phase difference between said predetermined reference signal and said second data signal to obtain second phase data; and a third operation circuit operatively coupled to said first and second operation circuits to calculate position detection data corresponding to the position-to-be-detected on the basis of said first and second phase data.

2. A phase difference detection device as defined in claim 1 wherein said third operation circuit is further adapted to obtain error data by calculating a difference between respective absolute values of said first and second phase data, and to obtain said position detection data by performing an operation to remove the error data from one of said first and second phase data.

3. A phase difference detection device as defined in claim 1, further comprising:

a fourth operation circuit operatively coupled to said first and second operation circuits to detect a coincidence in zero cross between said first and second data signals;

a holding circuit operatively coupled to said fourth operation circuit to, in response to detection of the coincidence in zero cross between said first and second data signals, hold error data based on an electric phase difference of at least one of said first and second data signals from said predetermined reference signal;

wherein, said third operation circuit is further adapted to, at least when said position-to-be-detected is moving, modify said position detection data based on the electric phase difference of said at least one of said first and second data signals by use of the error data.

4. A phase difference detection device as defined in claim 1 wherein said first and second function values are in a respective sine and cosine relation.

5. A phase difference detection device as defined in claim 1 wherein said third operation circuit is further adapted to add said first and second phase data.

6. A phase difference detection device as defined in claim 1 wherein said third operation circuit is further adapted to obtain error data by calculating a difference between respective absolute values of said first and second phase data, and outputs said error data as indicative of a temperature change of said device.

7. A method of detecting a position by use of an inductive position detector, said position detector being excited by a predetermined reference signal to generate a first output signal having been amplitude-modulated using, as an amplitude coefficient, a first function value corresponding to a position-to-be-detected and generate a second output signal having been amplitude-modulated using, as an amplitude coefficient, a second function value corresponding to the position-to-be-detected, said method comprising the steps of:

receiving said first and second output signals from said position detector;

forming first and second data signals by combining said received first and second output signals, said first data signal having an electric phase angle shifted in a positive direction in relation to the position-to-be-detected, said second data signal having an electric phase angle shifted in a negative direction in relation to the position-to-be-detected;

measuring an electric phase difference between said predetermined reference signal and said first data signal to obtain first phase data;

measuring an electric phase difference between said predetermined reference signal and said second data signal to obtain second phase data; and calculating position detection data corresponding to the position-to-be-detected on the basis of said first and second phase data.

8. A method of detecting a position as defined in claim 7 further comprising the steps of:

detecting a coincidence in zero cross between said first and second data signals;

holding, as error data, data based on said phase data in response to a coincidence in zero cross between said first and second data signals detected in said detecting step; and obtaining position detection data corresponding to the position-to-be-detected, by modifying said phase data by use of the error data held in said holding step, at least when the position-to-be-detected is moving.

* * * * *